United States Patent [19]

Urbish et al.

[11] Patent Number: 5,446,625

[45] Date of Patent: Aug. 29, 1995

[54] CHIP CARRIER HAVING COPPER PATTERN PLATED WITH GOLD ON ONE SURFACE AND DEVOID OF GOLD ON ANOTHER SURFACE

[75] Inventors: Glenn F. Urbish, Coral Springs; William B. Mullen, III, Boca Raton; Kingshuk Banerji, Plantation, all of Fla.

[73] Assignee: Motorola, Inc., Schaumburg, Ill.

[21] Appl. No.: 365,988

[22] Filed: Dec. 28, 1994

Related U.S. Application Data

[63] Continuation of Ser. No. 150,519, Nov. 10, 1993, abandoned.

[51] Int. Cl.⁶ .......................... H05K 7/02; H05K 1/18; H01L 23/28
[52] U.S. Cl. ........................................ 361/761; 361/768; 361/777; 361/760; 174/52.2; 174/260; 174/263; 257/779; 257/786; 257/787
[58] Field of Search .............. 174/52.2, 52.4, 260-263, 174/; 361/760-762, 765, 777, 767-768; 257/684, 692-693, 779-781, 784, 786, 787

[56] References Cited

U.S. PATENT DOCUMENTS 5,075,965  12/1991  Carey et al. ...................... 29/840
5,153,051  10/1992  Dorinski .
5,162,144  11/1992  Brown et al. .
5,241,133  8/1993  Mullen, III et al. .

OTHER PUBLICATIONS

Electronic Packaging and Production, A Cahners Publication, May 1992.
Microstructures and Mechanical Properties of Aging Materials, A Publication of TMS, Minerals, Metals & Materials, Proceedings of a Symposium sponsored by the Minerals, Metals and Materials Socciety held in conjunction with ASM International, pp. 431-442. Nov. 2-5, 1992.

*Primary Examiner*—Bot L. Ledynh
*Attorney, Agent, or Firm*—Andrew S. Fuller

[57] ABSTRACT

A chip carrier (20) includes a substrate (11) having a first copper pattern (12) deposited on a first surface (13), and a second copper pattern (14) deposited on a second surface (16). The second copper pattern (14) is plated with a metallic material to form wire bondable areas (18) on the second copper pattern (14), however, the first copper pattern (12) is substantially devoid of the metallic material. A device (21) is wire bonded to the wire bondable areas (18) of the second copper pattern (14), and a protective covering (23) covers the wire bondable areas (18).

3 Claims, 2 Drawing Sheets

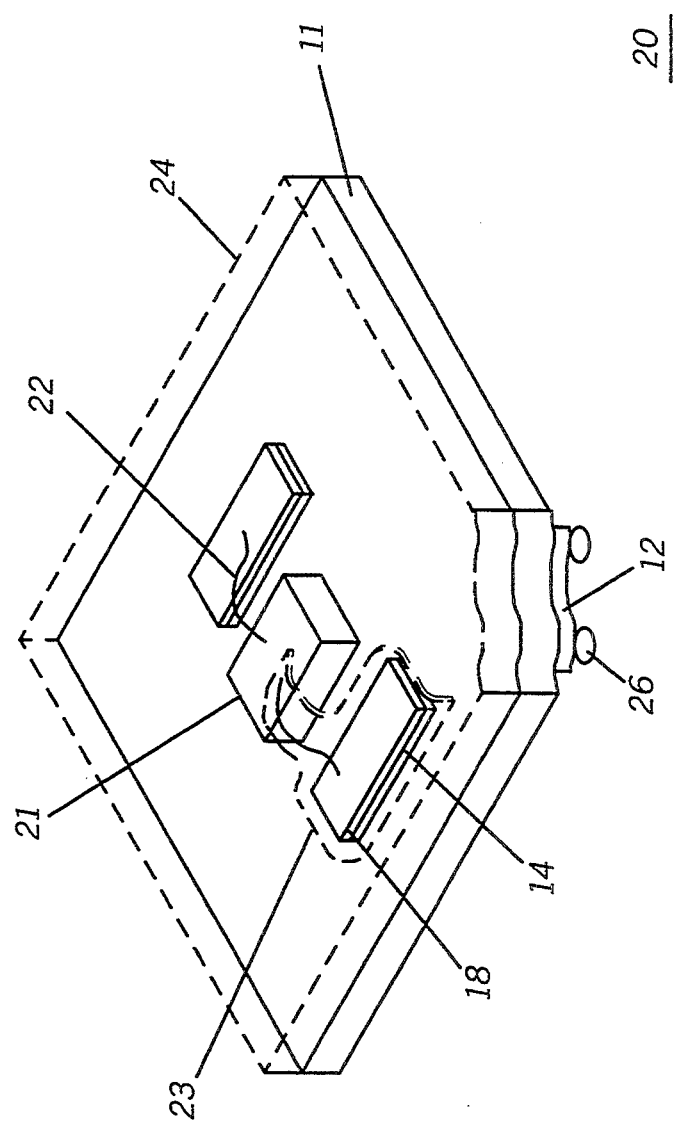

CHIP CARRIER HAVING COPPER PATTERN PLATED WITH GOLD ON ONE SURFACE AND DEVOID OF GOLD ON ANOTHER SURFACE

This is a Continuation of U.S. patent application Ser. No. 08/150,519, now abandoned, filed Nov. 10, 1993.

TECHNICAL FIELD

This invention relates generally to chip carriers, and more particularly, to chip carriers prepared to ensure reliable electrical connections thereto.

BACKGROUND OF THE INVENTION

Chip carriers typically use circuit carrying substrates in their manufacture. The typical substrate comprises copper plating applied to a polymeric dielectric layer, wherein the copper plating is patterned to form electrical conductors. Depending on the application, the substrate may have a portion requiring electrical interconnections of one form, such as by wire bonding, and another portion requiring electrical interconnections of another form, such as by soldering.

The chip carrier typically uses a substrate having opposing surfaces, with an electronic component, such as a semiconductor device, wire bonded to one of its surfaces. To support the wire bonding of the semiconductor device, many prior art implementations employ gold metallization over nickel and copper to form a wire bondable area on the substrate. Usually, gold is also disposed on other areas of the substrate to protect the copper plating from oxidation, and for simplicity in manufacturing. Additionally, some modern chip carrier packages use an array of solder balls on the mounting surface for providing electrical and mechanical support for the chip carrier. The solder balls are typically mounted directly on the gold metallized substrate. However, solder connections so made have resulted in solder joint failures in some applications.

Therefore, there exists to address the problem of unreliable solder connections, particularly on chip carriers using an array of solder balls as an electrical interconnection scheme.

BRIEF DESCRIPTION OF THE DRAWINGS

FIG. 2 is a chip carrier incorporating the substrate of FIG. 1, in accordance with the present invention.

DETAILED DESCRIPTION OF THE EMBODIMENTS

Figure 1:
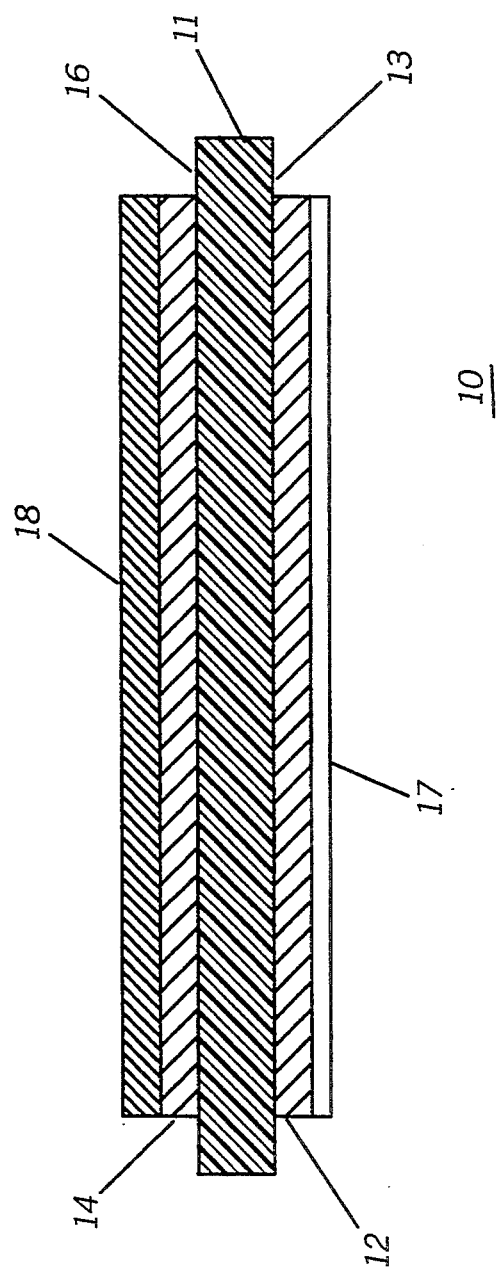
FIG. 1 is a circuit carrying substrate formed in accordance with the present invention.

Solder connections made directly to a gold containing material are unreliable in some applications. While gold provides a solderable surface, gold rapidly dissolves in molten solder and renders the solder brittle when a certain concentration of gold is exceeded. This can result in unreliable solder connections. Large chip carriers employing an electrical interconnection scheme using an array of solder balls, wherein the solder is applied to a surface containing gold, are particularly susceptible to the problem of solder joint brittleness. Typically, for chip carriers having a large array of solder balls, the solder deposit per ball tends to be small, thus increasing the potential effect of the gold.

Generally, the present invention provides for a chip carrier having a novelly prepared circuit carrying substrate. The substrate has copper disposed thereon, as is typical in the art, and has gold metallization selectively disposed on the copper. The substrate accommodates the use of solder to provide electrical and mechanical support to the substrate. The invention recognizes that gold causes brittleness for solder connections, and therefore avoids gold metallization on those portions of the substrate where solder connections are anticipated. The invention teaches a simple process for achieving gold metallization on one portion of the copper on the substrate while protecting the copper of other portions of the substrate. This process includes masking a portion of the copper on the substrate where solder connections are expected to prevent deposition of gold metallization on this portion. That portion of copper not receiving gold metallization is protected from oxidation during further processing of the substrate.

The present invention can be more fully understood with reference to FIGS. 1 and 2. FIG. 1 illustrates a circuit carrying substrate 10 formed from a substrate 11 having first and second opposing surfaces 13, 16. The first surface 13 has a first copper pattern 12 disposed thereon, and the second surface 16 has a second copper pattern 14 disposed thereon. A metallic material 18 containing gold is selectively disposed on the second copper pattern 14 to form a noncorroding gold metallization layer. The gold metallization layer 18 forms a wire bondable area which facilitates the electrical coupling of an electrical device to the copper pattern, such as by wire bonding, and the like. The substrate 11 also has a portion of the copper pattern, i.e., the first surface 13, which is substantially devoid of the gold metallization 18. This allows solder connections to be made directly to the copper pattern while avoiding any contact between the solder and the gold. Thus, the problem of solder brittleness caused by the gold is avoided. As copper is susceptible to oxidation when exposed to the environment, a portion of the copper not having gold metallization is treated to protect against oxidation during further processing of the circuit carrying substrate 10. Thus, an organic protectant 17 is disposed on the first copper pattern 12. The organic protectant 17 is from a family of alkylimidazoles, which includes imidizoles, benzotriazoles, alkyl benzimidizoles, and the like. The organic protectant 17 is commercially available as Entek TM from the Enthone-OMI corporation, or as Protecto TM from the Kester corporation, among others.

The substrate 11 is formed from an insulating material, such as a polymeric dielectric material, upon which copper plating is patterned to form electrical conductors. Using photo definition, followed by etching, the first copper pattern 12 is deposited on the first surface 13 of the substrate 11, and the second copper pattern 14 is deposited on the second surface 16 of the substrate 11. The substrate 11 may be further processed by applying solder mask, if required, over the copper pattern on one or both sides of the substrate 11. Next, the first surface 13 and the first copper pattern 12 are masked with a plating resist material. The mask can be applied by spraying, screening, dry laminating, or any similar process. The substrate 11 is then immersed in a plating bath containing a metallic material, including gold, wherein the second copper pattern 14 is plated with the metallic material to form a noncorroding layer 18 on the second copper pattern 14. The entire substrate 11 is submerged in the metal plating bath to which is applied an electrical excitation, a thermal excitation, or both. The plating resist material protects the first copper pattern 12 from being exposed to the metal plating solution, while the second copper pattern 14 receives the deposit of metallic material 18. Preferably, the deposit of metallic material comprises a deposit of nickel accompanied by a deposit of gold, which results in a outer layer of gold formed on the first surface 13. The gold is used to form wire bondable areas on the second copper pattern 14.

After the metallic material 18 plating process, the plating resist mask is removed from the first copper pattern 12 and the first surface 13. The mask material can be removed by applying a solvent that dissolves the mask. Next, the substrate 11, including the exposed copper pattern of the first surface 13 and the gold layered second surface 16, is cleaned with a cleaning solution. The organic protectant 17 is then deposited on the first surface 13 and the first copper pattern 12, such that the first copper pattern 12 is coated to protect against oxidation of the copper. The substrate 11 fabricated as described thus far, can have wire bonding or gold plated contacts on the second surface 16, and soldered connections on the first surface 13 side 13, without risking damage to the solder connections from brittleness caused by gold.

FIG. 2 illustrates a chip carrier package 20 formed using the substrate 11. The chip carrier 20 formed using overmolded pad array chip carrier 20 technology, and has a grid array of solder balls (ball grid array) to provide soldered connections to the device. The chip carrier package is similar in nature to a package described in U.S. Pat. No. 5,241,133, issued to Mullen, III et al. on Nov. 16, 1992, for a Leadless Pad Array Chip Carrier. A semiconductor device 21 is wire bonded to the wire bondable areas of the first surface 13. Additional devices may be mounted onto the substrate 11 as necessary. Wires 22 extend from the semiconductor device 21 to bond pads formed on the wire bondable areas. The wire bondable areas and the wires 22 are protected by a first protective coveting 23, generally by an encapsulating material, such as overmolded plastic, or the like. A second protective covering 24 substantially encapsulates the second surface 16. An array of solder balls or solder deposits 26 is attached to the first copper pattern 12, typically by using solder flux followed by a solder reflow process, as is well known in the art, to produce a solder ball grid array. The process for attaching the solder balls 26 also dissipates the organic protectant 17, thus establishing the proper contact between the solder balls 26 and the first copper pattern 12.

It is important to note that the ordering of the steps outlined above may vary to improve manufacturing efficiency or otherwise. For example, to construct the chip carrier 20, the steps of removing the plating resist material from the first surface 13 and the first copper pattern 12, and depositing the organic protectant on the first surface 13 and the first copper pattern 12, could be performed after the first or second protective covering 23, 24 was applied to the second surface 16.

The present invention provides a method and apparatus for fabricating a substrate 11, and a chip carrier 20 incorporating the substrate 11. The chip carrier 20 is surface mountable with a plurality of solder balls 26 available for electrical interconnection. These solder balls 26 do not contain gold, or any other material which cause brittleness in solder. Many ball grid array packages having a large number of electrical ports require a large contact area to accommodate the cumulative requirements of the solder ball connections. The solder joints of a ball grid array package are subjected to considerable thermal and mechanical stresses over its expected life. Brittleness caused gold seepage in the solder exacerbates this problem. Prior art surface mountable ball grid arrays that have a wire bonded integrated circuits usually include gold on both the wire bondable surface and also on the solder ball surface of the substrate. This may cause failure of the solder joints With the method taught by the present invention, gold in solder joints is avoided, thereby increasing long term reliability, particularly in ball grid array packages.

What is claimed is:

1. A pad array chip carrier, comprising:
a substrate having a first surface with a first copper pattern disposed thereon, and a second opposing surface with a second copper pattern disposed thereon, the second copper pattern having gold disposed thereon to form wire bondable areas, the first copper pattern being devoid of gold;
a semiconductor device disposed on the second opposing surface, the device being wire bonded to the wire bondable areas of the second copper pattern;
an array Of solder deposits disposed on the first copper pattern of the first surface; and
a protective coveting about the wire bondable areas.

2. The pad array chip carrier of claim 1, wherein the device is encapsulated with an overmolded plastic protective covering.

3. A pad array chip carrier, comprising:
a substrate having a first surface with a first copper pattern deposited thereon, and a second surface with a second copper pattern deposited thereon, wherein the second copper pattern is plated with gold to form wire bondable areas on the second copper pattern and the first copper pattern is devoid of gold;
a semiconductor device wire bonded to the wire bondable areas of the second copper pattern;
an overmolded protective covering substantially encapsulating the second surface including the device and the wire bondable areas; and
solder balls disposed on the first copper pattern to produce a ball grid array.

* * * * *